(12) United States Patent
Shim et al.

(10) Patent No.: US 11,634,340 B2
(45) Date of Patent: *Apr. 25, 2023

(54) LAYERED GROUP III-V COMPOUND AND NANOSHEET CONTAINING ARSENIC, AND ELECTRICAL DEVICE USING THE SAME

(71) Applicant: Industry-Academic Cooperation Foundation, Yonsei University, Seoul (KR)

(72) Inventors: Woo-young Shim, Seoul (KR); Sang-jin Choi, Seoul (KR); Tae-young Kim, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 141 days.

This patent is subject to a terminal disclaimer.

(21) Appl. No.: 17/111,153

(22) Filed: Dec. 3, 2020

(65) Prior Publication Data
US 2022/0073365 A1 Mar. 10, 2022

(30) Foreign Application Priority Data

Sep. 9, 2020 (KR) .................. 10-2020-0115371
Sep. 14, 2020 (KR) .................. 10-2020-0117536

(51) Int. Cl.
*C30B 29/42* (2006.01)
*C01G 28/00* (2006.01)
(Continued)

(52) U.S. Cl.
CPC ............ *C01G 28/002* (2013.01); *C30B 28/02* (2013.01); *C30B 29/42* (2013.01); *C30B 29/68* (2013.01);
(Continued)

(58) Field of Classification Search
CPC ......... C30B 28/02; C30B 29/68; C30B 29/42; C01G 28/002; B82Y 40/00; C01P 2004/24; C01P 2006/40
See application file for complete search history.

(56) References Cited

U.S. PATENT DOCUMENTS 5,140,385 A * 8/1992 Kukimoto ............. H01L 33/285
257/609
5,633,192 A * 5/1997 Moustakas .......... H01L 21/0237
438/46
(Continued)

FOREIGN PATENT DOCUMENTS

KR    20140049190 A    4/2014
KR    20190132148 A    11/2019
(Continued)

*Primary Examiner* — Robert M Kunemund
(74) *Attorney, Agent, or Firm* — Bridgeway IP Law Group, PLLC; Jihun Kim (57) ABSTRACT

Proposed are a layered Group III-V arsenic compound, a Group III-V nanosheet that may be prepared using the same, and an electrical device including the materials. There is proposed a layered compound having a composition represented by [Formula 1] Mx-mAyAsz (Where M is at least one of Group I elements, A is at least one of Group III elements, x, y, and z are positive numbers which are determined according to stoichiometric ratios to ensure charge balance when m is 0, and 0<m<x).

17 Claims, 9 Drawing Sheets

(51) Int. Cl.
  *C30B 28/02*  (2006.01)
  *C30B 29/68*  (2006.01)
  *B82Y 30/00*  (2011.01)
  *B82Y 40/00*  (2011.01)

(52) U.S. Cl.
  CPC ............. *B82Y 30/00* (2013.01); *B82Y 40/00* (2013.01); *C01P 2004/24* (2013.01); *C01P 2006/40* (2013.01)

(56) References Cited

U.S. PATENT DOCUMENTS

| | | | |
|---|---|---|---|
| 2019/0157386 A1* | 5/2019 | Ando | H01L 29/775 |
| 2019/0352799 A1* | 11/2019 | Shim | C30B 11/00 |
| 2021/0073488 A1* | 3/2021 | Turner | G06K 19/0709 |

FOREIGN PATENT DOCUMENTS

| | | | |
|---|---|---|---|
| KR | 20190132152 A | 11/2019 | |
| KR | 20190132294 A | 11/2019 | |
| KR | 10-2057700 B1 | 12/2019 | |

* cited by examiner

FIG. 1

Sample A        Sample B

LAYERED GROUP III-V COMPOUND AND NANOSHEET CONTAINING ARSENIC, AND ELECTRICAL DEVICE USING THE SAME

BACKGROUND OF THE INVENTION

1. Field of the Invention

The present invention relates to a layered Group III-V compound and a nanosheet containing arsenic, and an electrical device using the same, and more particularly, to a layered Group III-V compound and a nanosheet containing an alkali metal and containing arsenic having various electrical properties, and an electrical device using the same.

2. Description of the Related Art

Layered compounds connected to interlayers through van der Waals bonds may show various properties, and the layered compounds may be delaminated through physical or chemical methods to prepare two-dimensional (2D) nanosheets having a thickness of several to hundreds of nanometers, and thus, active research into the layered compounds is underway.

In particular, low-dimensional materials such as nanosheets are expected to have innovative new functions that existing bulk materials fail to provide, and are highly likely to serve as next-generation future materials instead of the existing materials.

However, up until now, the layered compounds having a two-dimensional crystal structure are limited to materials such as graphite, transition metals, and chalcogen compounds to hardly develop into materials of various compositions.

Meanwhile, Group III-V compounds containing gallium arsenide or indium arsenide are widely used in high-power, high-frequency electrical devices as a compound semiconductor material but Group III-V compounds having a layered structure are not specifically known till now.

Group III-V arsenic compounds having a layered structure, unlike existing Group III-V arsenic compounds having a different crystal structure, are expected to allow diversified application, and to be applicable to new areas that have not been reached before.

RELATED ART DOCUMENT

[Patent Document]
Korean Registered Patent Publication No. 10-2057700
Korean Patent Laid-open Publication No. 2019-0132294
Korean Patent Laid-open Publication No. 2019-0132152

SUMMARY OF THE INVENTION

According to an embodiment of the invention, there are provided a layered Group III-V arsenic compound, a Group III-V nanosheet that may be prepared using the same, and an electrical device including the materials.

According to a first aspect of the invention, there is provided a layered compound having a composition represented by Formula 1 below.

[Formula 1]

(Where M is at least one of Group I elements, A is at least one of Group III elements, x, y, and z are positive numbers which are determined according to stoichiometric ratios to ensure charge balance when m is 0, and $0<m<x$).

According to a second aspect of the invention, there is provided a nanosheet containing a compound represented by Formula 1 below and, prepared through a physical or chemical peeling method.

According to a third aspect of the invention, there is provided an electrical device including the layered compound of the first aspect or the nanosheet of the second aspect.

Embodiments of the invention provide a layered Group III-V arsenic compound having various compositions or a nanosheet, and the compound and the nanosheet may have various electrical properties to enable application to various electrical devices.

DETAILED DESCRIPTION OF THE EXEMPLARY EMBODIMENTS

Hereinafter, configuration and operation of embodiments of the invention will be described with reference to the accompanying drawings. In the following description, when it is determined that the specific description of the known related art unnecessarily obscures the gist of the invention, the detailed description thereof will be omitted. In addition, when an element "includes" a component, it may indicate that the element does not exclude another component unless explicitly described to the contrary, but can further include another component.

A compound according to an embodiment of the invention is represented by Formula 1 and has a layered structure.

[Formula 1] $M_{x-m}A_yAs_z$ (Where M is at least one of Group I elements, A is at least one of Group III elements, x, y, and z are positive numbers which are determined according to stoichiometric ratios to ensure charge balance when m is 0, and $0<m<x$).

In addition, the compound of an embodiment of the invention has a layered structure, and in general, Group III-V arsenic compounds such as a GaAs compound or an InAs compound have a three-dimensional structure, having difficulty in exhibiting a layered structure. In order to overcome the limitation, inventors of the invention added Group I elements (hereinafter referred to as an "additive element") to a Group III-V compound (hereinafter referred to as a "Group III-V compound") to place the additive elements between Group III-V compound layers to prepare a layered compound in which the Group III-V compound layers are connected. The additive elements positioned between the Group III-V compound layers provide a weak bond between the Group III-V compound layers through van der Waals force, and thus a plane on which the additive elements are positioned forms a cleavage plane that is easily cleaved along the plane.

Accordingly, the layered compound according to an embodiment of the invention may be easily peeled off along the cleavage plane through either or both physical or chemical methods, and the peeling is more easily achieved with an increasing amount of the additive elements removed. Therefore, a Group III-V compound nanosheet may be easily prepared from the layered compound, and in this case, the additive elements partially remain in the Group III-V compound nanosheet.

With the continuous removal of the additive elements, the interlayer distance between the Group III-V compound layers gradually becomes greater, and eventually the bond between the layers breaks down, which may cause cracks between the layers. Therefore, the layered structure of the layered compound described in an embodiment of the invention includes a case where repeating two-dimensional Group III-V compound layers are interlayer-bonded through van der Waals bonds by additive elements as well as a case where the interlayer bonding force of the Group III-V compound is completely or partially removed to increase the interlayer distance, thereby forming cracks.

In addition, the two-dimensional Group III-V compound layers may exhibit a two-dimensional bonding structure before the removal of additive elements, but when the additive elements are removed greater than a certain level, the bonding structure may change in the Group III-V compound layers, and the structure change may include a change from a two-dimensional bonding structure before the removal to a three-dimensional bonding structure, for example, a zinc blende structure or a wurtzite structure. However, even in this case, since the compound layers keep the two-dimensional shape, except the change in the crystal structure in the layers, the compound layers still exhibit the layered structure due to the structure that the interlayer bonding keeps the van der Waals bonds by additive elements.

Therefore, in an embodiment of the invention, the layered structure includes a case where the Group III-V compound layers form two-dimensional bond in respective layers and form inter-layer-bonds through van der Waals bond by additive elements as well as a case where cracks are formed between the layers with the removal of additive elements, and further includes a case where the Group III-V compound layers are three-dimensionally bonded, but these layers keep a two-dimensional shape, and the bond between these layers is a van der Waals bond by additive elements rather than a bond between Group III-V compounds or the bonding force is completely or partially removed, thereby forming cracks.

Figure 1:
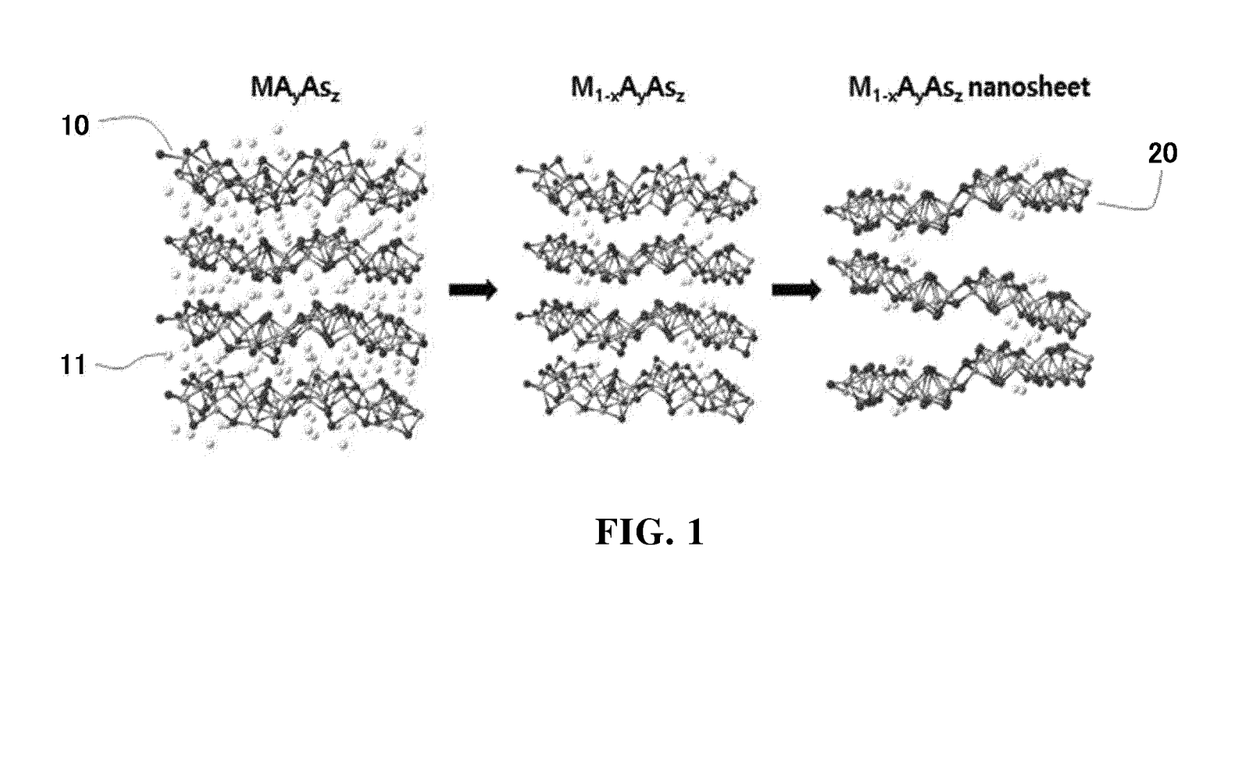
FIG. 1 is a conceptual view illustrating a layered Group III-V arsenic compound according to an embodiment of the invention and a nanosheet prepared using the same.

A conceptual view for examples of the layered compound and a nanosheet prepared therefrom is shown in FIG. 1. First, a layered Group III-V compound is synthesized using additive elements. In this case, the layered Group III-V compound, which is a Group III-V compound, keeps a layered structure through additive elements 11, the additive elements 11 which are Group I elements, are positioned between $A_yAs_z$ layers 10 which are Group III-V compounds, to keep the bonding between the layers 10 through the van der Waals bonds, and when the additive elements 11 are removed, the bonding force between the $A_yAs_z$ layers 10 in $M_{x-m}A_yAs_z$ decreases or the interlayer distance increases, thereby forming cracks, and accordingly, in the end, a $M_{x-m}A_yAs_z$ nanosheet 20 is prepared by being peeled off from the layered compound.

The nanosheet 20 prepared when peeled off from the layered compound is formed of a plurality of $A_yAs_z$ layers of two or more overlapping each other, and may thus be several hundreds of nm thick. In general, nanosheets may exhibit anisotropy according to a two-dimensional shape only when a thickness to a lateral width is less than a certain level. To this end, the ratio of a thickness (d) to a width (L) of a nanosheet (d/L) is preferably 0.1 or less. A width of the nanosheet prepared through an embodiment of the invention may be 5 m or more, and thus, a thickness of the nanosheet is preferably 500 nm or less.

As described above, the nanosheet according to an embodiment of the invention is a sheet peeled off from the layered compound, which includes two or more two-dimensional Group III-V compound layers, and includes a case where the Group III-V compound layers, when provided in plurality, are bonded through van der Waals bonds by additive elements. In this case, the two-dimensional Group III-V compound layers may be a two-dimensional bonding structure or a three-dimensional bonding structure.

The peeling method may be a physical or chemical peeling method, and a generally known peeling method using a tape may be used. In addition, to enable easier peeling, the peeling may be performed through irradiation with ultrasonic waves in a liquid state or using a tape after chemical treatment in an acid or base solution.

Additive elements may be Group I elements such as Li, Na, K, Rb, Cs, Fr, etc. In particular, Na and K, which are Group I elements, may be advantageous as additive elements to synthesize layered compounds.

Group III-V compounds forming $A_yAs_z$ layers include, for example, GaAs, InAs, AlAs, etc., and an embodiment of the invention is not necessarily limited to the exemplified compounds.

Residual additive elements may satisfy $0<m<x$, preferably $0.1<m<0.9x$, and more preferably $0.25x<m<0.75x$, according to Formula 1 described above. In preparing a Group III-V compound having a layered structure, it is preferable that additive elements to prepare a layered structure are completely removed. However, in the compound according to an embodiment of the invention, the additive elements to form a layered structure are not completely removed as the composition range described above and controlled such that a certain amount of the additive elements remains, so that new electrical properties such as ferroelectric-like properties are implemented in the Group III-V compound having a layered structure.

In $M_{x-m}A_yAs_z$ of Formula 1 above, x, y, and z refer to positive numbers at which M, A, and As elements have a charge balance according to stoichiometric ratios. In this case, as m is greater than 0 and smaller than x, vacancy is created in the place of additive elements M.

When the vacancy is created, the additive elements M positioned between the $A_yAs_z$ layers may move between the layers by an external magnetic field or electric field, and accordingly, the layered compound may exhibit ferroelectric-like properties.

In general, ferroelectric-like properties are found in oxides of an asymmetric structure such as $BaTiO_3$ having a perovskite structure. In the oxides of an asymmetric structure such as $BaTiO_3$, ferroelectric-like properties are shown according to changes in the position of Ba located in the center.

In contrast, the layered compound and the nanosheet according to an embodiment of the invention exhibit ferroelectric-like properties due to the movement of additive elements between the layers, despite having a polar-symmetry structure instead of the asymmetric structure.

In this stable $M_xA_yAs_z$, as the partial removal of the additive elements M comes with ferroelectric-like properties, m has to be greater than 0, and smaller than x to make sure that at least some of the additive elements remain.

Meanwhile, when m is removed in a too small amount, the movement between the layers may not be easy, and thus, m is 0.1× or greater, and when m is removed in an excessive amount, the layered structure may break down or there may be no additive elements required for the movement, thereby failing to obtain ferroelectric properties, and thus, m is preferably 0.9× or less, and more preferably 0.25× to 0.75×.

In addition, the layered compound and the nanosheet according to an embodiment of the invention may exhibit resistance switching properties.

When a material has resistance switching properties, current does not increase linearly according to voltages applied to the material, but when an initial voltage is applied, the material keeps a high resistance state to have an insignificant increase in the current and then when the material reaches a certain critical point, the material switches to a low resistance state to have a sharp increase in the current.

These resistance switching properties are generally found in oxides, and recently, using these properties, memory devices such as a memristor capable of storing information like a flash memory have been actively developed.

When preparing a Group III-V compound according to an embodiment of the invention or a nanosheet formed of the compound, M as an additive element is added to synthesize a layered compound having a composition of $M_xA_yAs_z$, and then the additive element, M is partially removed using an acid, and a layered compound having a composition of $M_{x-m}A_yAs_z$ may thus be prepared.

As such, when the additive element is removed through the strong acid, the place where the additive element is partially removed is replaced with hydrogen ions included in the strong acid, and as shown in Formula 2 below, a layered compound containing hydrogen and a nanosheet formed of the compound may be prepared $$M_{x-m}H_nA_yAs_z \quad \text{[Formula 2]}$$

(Where M is at least one of Group I elements, A is at least one of Group III elements, x, y, and z are positive numbers which are determined according to stoichiometric ratios to ensure charge balance when m is 0, and 0<m<x and 0<n<m).

As described above, the range of m may be preferably equal to or more than 0.1× and equal to or less than 0.9×, and more preferably equal to or more than 0.25× and equal to or less than 0.75×.

As such, the hydrogen-containing layered compound and nanosheet may have ferroelectric-like properties despite having a polar-symmetry structure as described above, and have resistance switching properties as well to be applied to various electrical devices, and in particular, to become applicable to memory devices such as memristors.

Example 1

1) Synthesis of $Na_2Ga_2As_3$ having a layered structure

Na, Ga, and As were weighed at a molar ratio of 7.8:3.4:7.5, mixed, and then put into an alumina crucible. Next, the mixture was placed in a quartz tube which was then double-sealed to block outside air. The process was performed in a glove box under argon atmosphere.

Thereafter, the resultant was put at a temperature raised to 750° C. in a box furnace, kept for 40 hours, and cooled to room temperature for 300 hours to obtain a sample of $Na_2Ga_2As_3$.

2) Removal of Na

Na was partially removed from $Na_2Ga_2As_3$ through reaction in a saturated $GaCl_3$ solution for 6 hours to 24 hours. The results are shown in Table 1 below. Residual Na in Table 1 shows the results obtained through Energy dispersive X-ray spectroscopy(EDS) analysis.

TABLE 1

| Name of sample | Reaction time | Residual Na (at %) |
|---|---|---|
| Sample A | — | 28.5 |
| Sample B | 6 hours | 14.0 |
| Sample C | 12 hours | 7.7 |
| Sample D | 24 hours | 4.8 |

3) Process of preparing nanosheets

The samples prepared as in Table 1 above were irradiated with ultrasonic waves in ethanol to prepare nanosheets peeled off therefrom using a tape.

Example 2

1) Synthesis of $K_2In_2As_3$ having a layered structure

K, In, and As were weighed, mixed, and then put into an alumina crucible. Next, the mixture was placed in a quartz tube which was then double-sealed to block outside air. The process was performed in a glove box under argon atmosphere. Next, the resultant was put at a temperature raised to 850° C. in a box furnace and kept for 12 hours. Thereafter, for recrystallization and crystal growth, the resultant was cooled to 500° C. at a temperature reduction rate of 5° C./h, and then kept for 100 hours at 500° C. and cooled to room temperature to obtain a sample of $K_2In_2As_3$ having a monoclinic crystal structure of a space group of $P2_{1/c}$.

2) Removal of K

The layered $K_2In_2As_3$ was subjected to reaction over time in a 0.25 M HCl solution diluted with ethanol to remove K therefrom. The results are shown in the table below. Residual K in Table 2 shows the results obtained through EDS analysis.

TABLE 2

| Name of sample | Removal of additive elements | Reaction time | Residual K (at %) |
|---|---|---|---|
| Sample A | — | — | 28 |
| Sample B | Hydrochloric acid | 1 hour | 22 |
| Sample C | Hydrochloric acid | 2 hours | 12.3 |
| Sample D | Hydrochloric acid | 3.5 hours | 5.95 |
| Sample E | Hydrochloric acid | 8 hours | 1.2 |

3) Process of preparing nanosheets

The samples prepared as in Table 2 above were irradiated with ultrasonic waves in ethanol to prepare peeled nanosheets using a tape.

Results of analyzing the samples prepared according to Examples 1 and 2 will be described below.

FIGS. 2A to 3B show results of analyzing the samples prepared according to Example 1 of the invention.

Figure 2A:
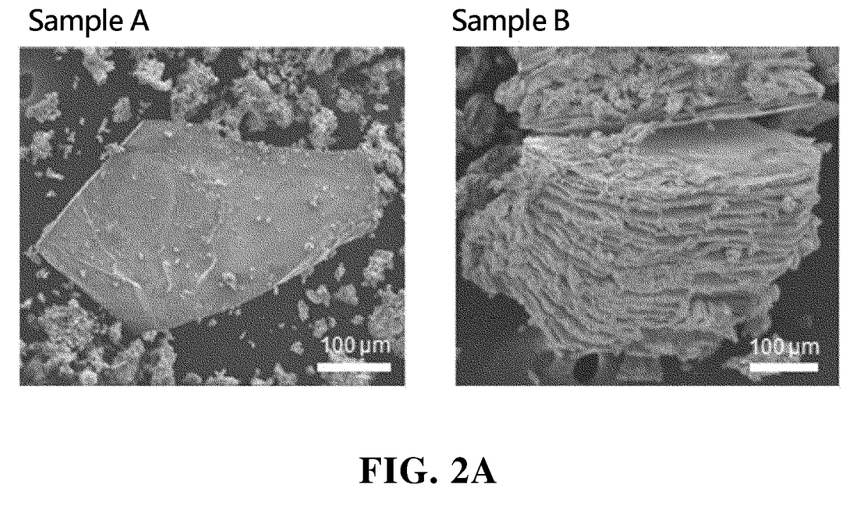
FIG. 2A to 2D are results of analyzing samples according to Example 1 of the invention.

FIG. 2A is a scanning electron microscopy image of Sample A and Sample B of Example 1, and it was found that interlayer cracks were formed after the removal of the additive elements from acid. Accordingly, easier peeling was enabled to prepare nanosheets.

Figure 2B:
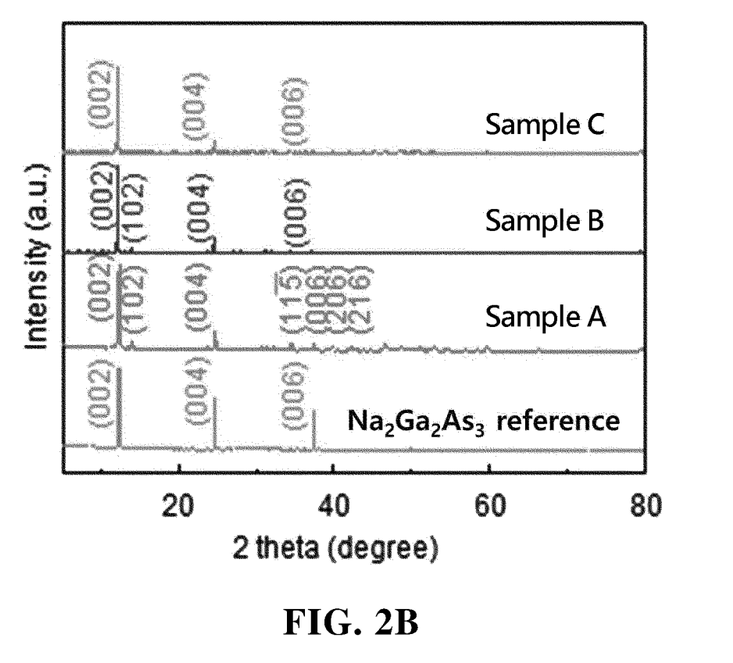

FIG. 2B shows XRD data of $Na_2Ga_2As_3$ reference data of a layered structure and XRD data of Samples A to C in Example 1 of the invention. In Samples B and C from which Na was partially removed, main peaks such as (002), (102), (004), and (006) remained, indicating that the space group of P2$_{1/c}$, which is a layered structure of parent structure Na$_2$Ga$_2$As$_3$ was kept.

Figure 2C:
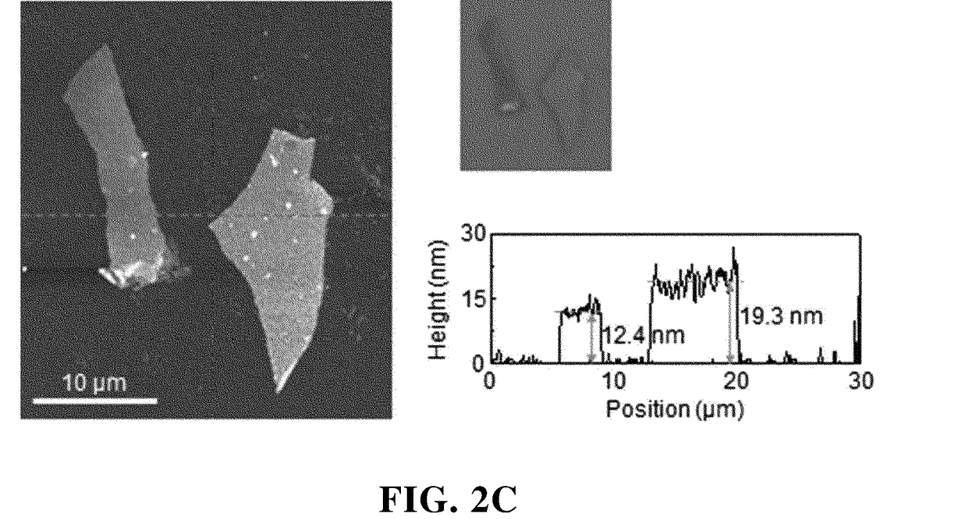

FIG. 2C shows an atomic force microscopy (AFM) image of a nanosheet peeled from Sample B of Example 1 and a line-profile therefrom. It was confirmed that a nanosheet was peeled off to have a thickness of 20 nm or less.

Figure 2D:
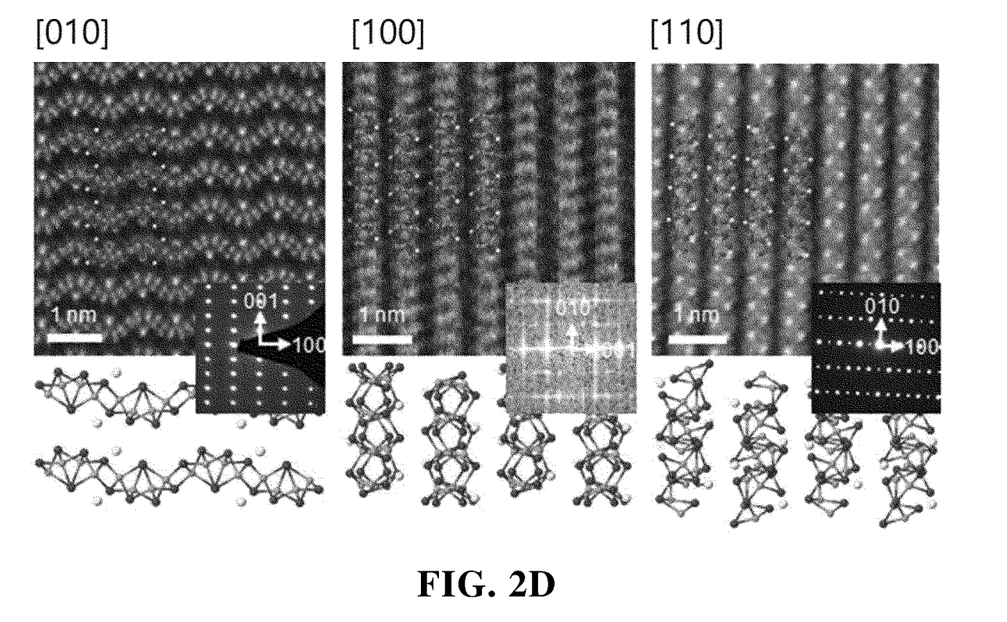

FIG. 2D is a scanning transmission electron microscopy (STEM) image and an electron diffraction (ED) pattern for a cross section in [010], [100], and [110] directions for Sample B of Example 1, and it was found that change to a different structure or amorphization was not caused after Na was partially removed when compared to before the removal of Na to allow the layered structure to be kept.

Figure 3A:
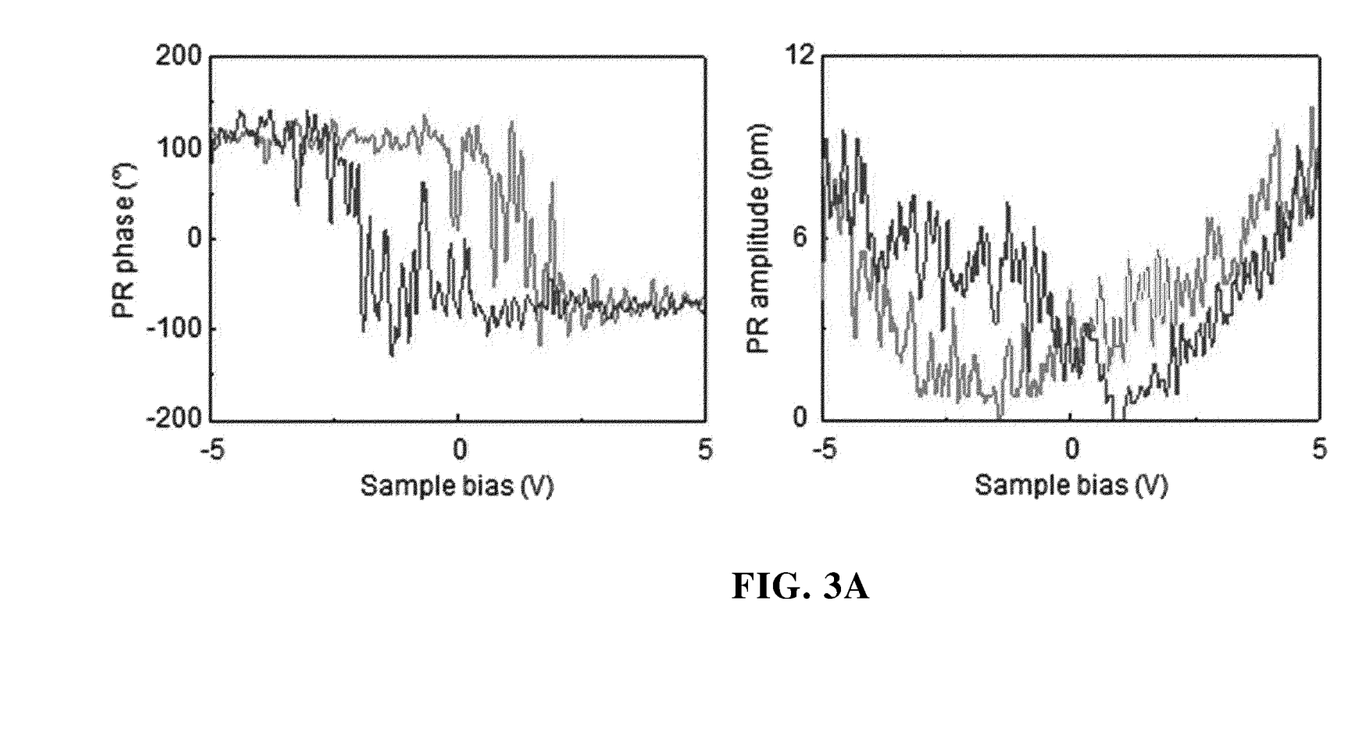
FIGS. 3A and 3B are results of analyzing electrical properties of samples according to Example 1 of the invention.

In FIG. 3A, ferroelectric properties were measured through piezoresponse force microscopy (PFM) for the nanosheet peeled from Sample B, and the measurement results showed a hysteresis loop. From the results, it was confirmed that the compound prepared according to Example 1 had ferroelectric-like properties.

Figure 3B:
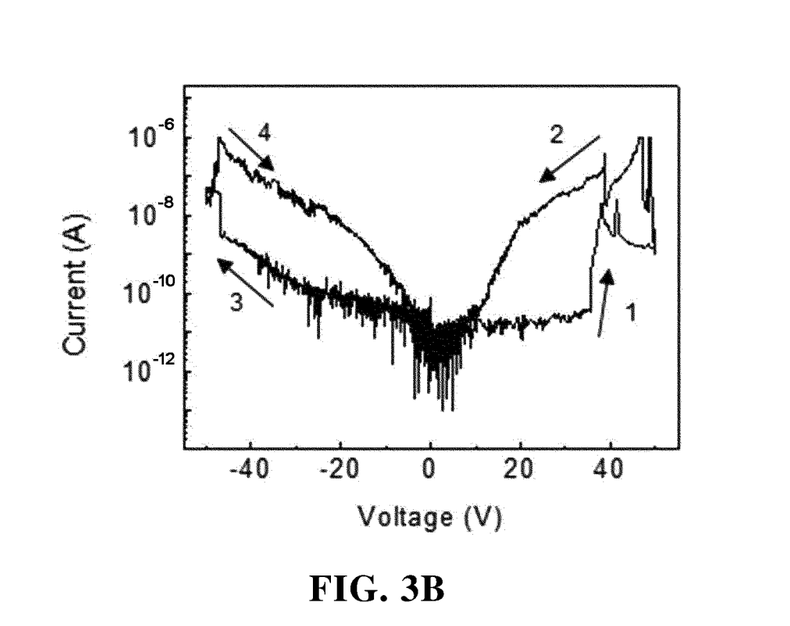

In addition, current changes according to voltages were measured for the nanosheet peeled off from Sample B, and results are shown in FIG. 3B. It was found that at an initial voltage, the nanosheet kept a high resistance state 1, indicating a low current flow, but when the voltage was greater than a certain level, the nanosheet switched to a low resistance state 2, indicating a sharp increase in the current, and the same properties were shown in an opposite electrode direction, thereby exhibiting resistance switching properties. From the results, it was confirmed that the compound prepared according to Example 1 of the invention exhibited resistance switching properties.

FIGS. 4A to 5B show results of analyzing the samples prepared according to Example 2 of the invention.

Figure 4A:
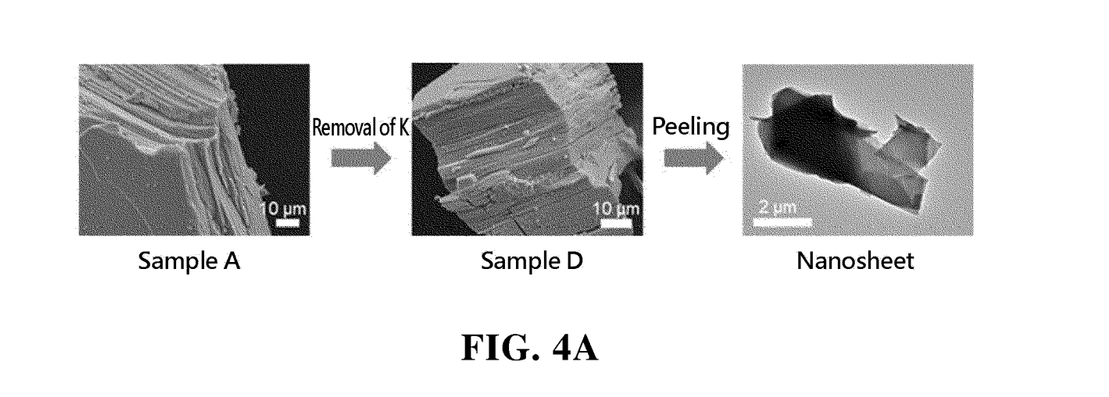
FIG. 4A to 4D are results of sample analysis according to Example 2 of the invention.

FIG. 4A shows a nanosheet prepared after the removal of K from Sample A of Example 2 to become Sample D, and being peeled off from Sample D using a tape. In Sample A, a cleavage plane between the layers was observed, but in Sample D, with the removal of K, the interlayer distance increased to form cracks in some sections.

Figure 4B:
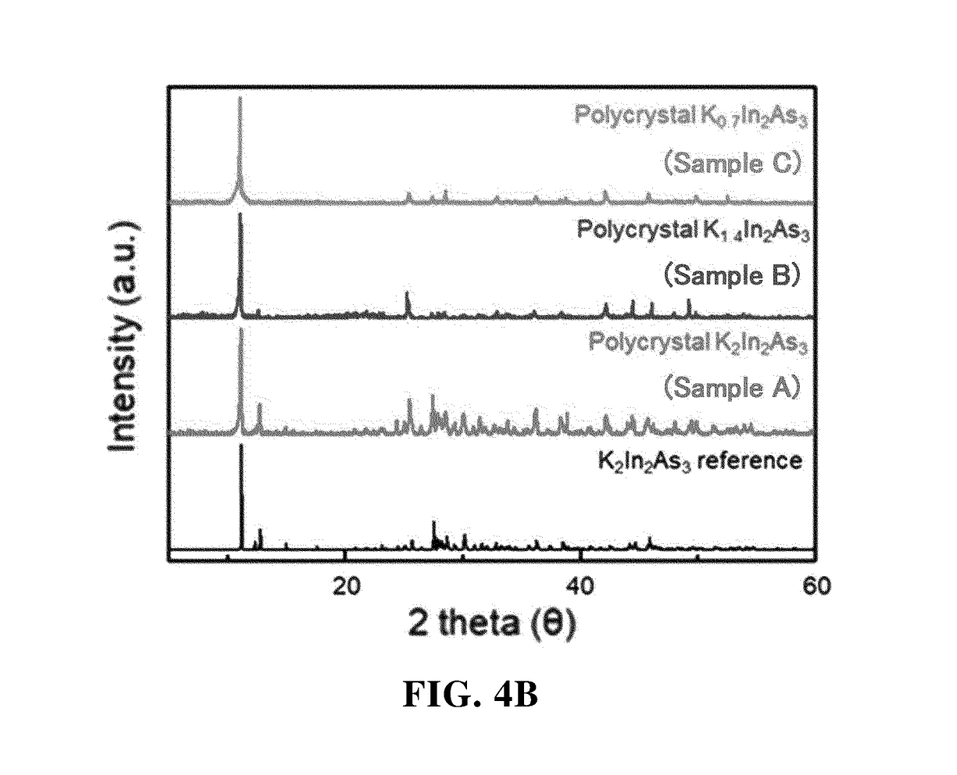

FIG. 4B shows XRD peaks and changes thereof for samples before and after the removal of K in Example 2. It was found that the peaks of the (002) plane and (022) plane were shown at 11.2°±0.50° and 27.5°±0.50°, respectively, equally in Sample A before the removal of K, and Sample B and Sample C after the partial removal of K. Therefore, it was found that the space group of P2$_{1/c}$, which is a layered structure, was kept both before and after the removal of K.

Figure 4C:
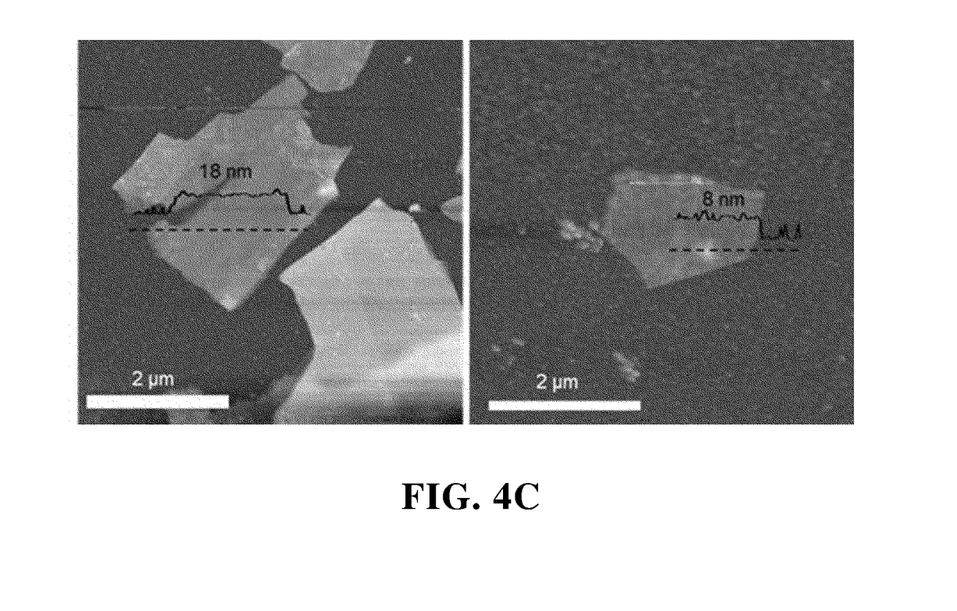

FIG. 4C shows an AFM image of a nanosheet prepared by being peeled off from Sample D in Example 2 and a line profile therefrom. It was confirmed that a nanosheet was peeled off to have a thickness of 8 nm to 18 nm.

Figure 4D:
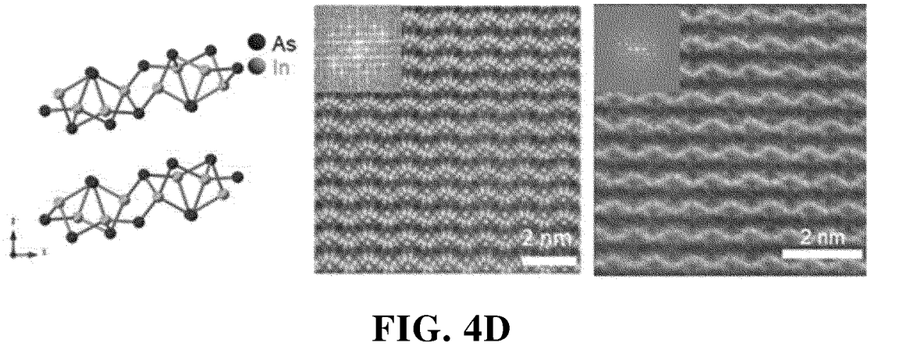

FIG. 4D shows results of STEM measurement for Sample C in Example 2, and it was found that the crystal structure was kept even after the removal of K.

Figure 5A:
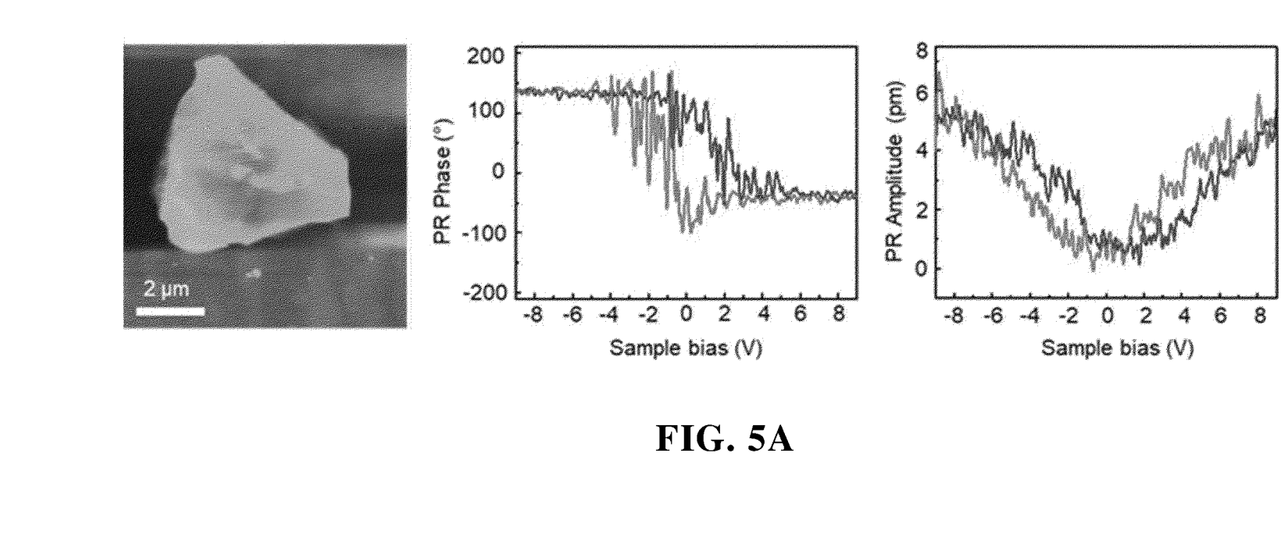
FIGS. 5A and 5B are results of analyzing electrical properties of samples according to Example 2 of the invention.

FIG. 5A shows ferroelectric properties measured through PFM for the nanosheet peeled off from Sample C of Example 2, and the measurement results show a hysteresis loop. From the results, it was confirmed that the compound prepared according to Example 2 had ferroelectric-like properties.

Figure 5B:
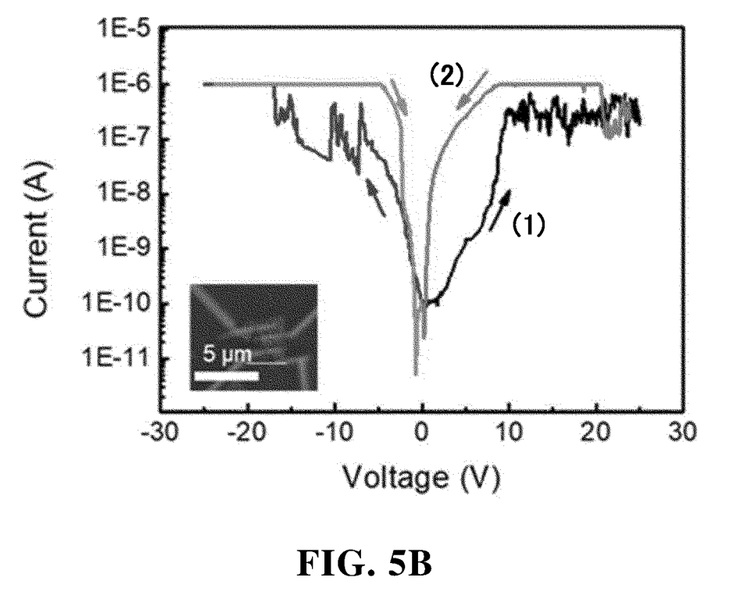

In addition, in FIG. 5B, current changes according to voltages were measured for the nanosheet peeled off from Sample C, and results are shown. It was found that at an initial voltage, the nanosheet kept a high resistance state 1, indicating a low current flow, but when the voltage was greater than a certain level, the nanosheet switched to a low resistance state 2, indicating a sharp increase in the current, and the same properties were shown in an opposite electrode direction, thereby exhibiting resistance switching properties.

What is claimed is:

1. A layered compound having a composition represented by Formula 1 below:

$$M_{x-m}A_yAs_z \quad \text{[Formula 1]}$$

wherein M is at least one of Group I elements, A is at least one of Group III elements, x, y, and z are positive numbers which are determined according to stoichiometric ratios to ensure charge balance, and wherein the m is greater than 0 and satisfies 0.1≤m≤0.9x.

2. The layered compound according to claim 1, wherein the m satisfies 0.25x≤m≤0.75x.

3. The layered compound according to claim 1, wherein the M is Na, K or a combination thereof.

4. The layered compound according to claim 1, wherein the A is Ga, In or a combination thereof.

5. The layered compound according to claim 1, wherein the layered compound further comprises H.

6. The layered compound according to claim 1, wherein the crystal structure of the layered compound exhibits a space group of P2$_{1/c}$.

7. The layered compound according to claim 1, wherein the layered compound exhibits ferroelectric-like properties.

8. The layered compound according to claim 1, wherein the layered compound exhibits resistance switching properties.

9. A nanosheet comprising a composition represented by Formula 1 below and two or more two-dimensional layers, the nanosheet being prepared through a physical or chemical peeling method:

$$M_{x-m}A_yAs_z \quad \text{[Formula 1]}$$

wherein M is at least one of Group I elements, A is at least one of Group III elements, x, y, and z are positive numbers which are determined according to stoichiometric ratios to ensure charge balance, and wherein the m is greater than 0 and satisfies 0.1x≤m≤0.9x.

10. The nanosheet according to claim 9, wherein the m satisfies 0.25x≤m≤0.75x.

11. The nanosheet according to claim wherein the M is Na, K or a combination thereof.

12. The nanosheet according to claim 9, wherein the A is Ga, In or a combination thereof.

13. The nanosheet according to claim 9, wherein the nanosheet further comprises H.

14. The nanosheet according to claim 9, wherein the crystal structure of the nanosheet has a space group of P2$_{1/c}$.

15. The nanosheet according to claim 9, wherein the nanosheet exhibits ferroelectric-like properties.

16. The nanosheet according to claim 9, wherein the nanosheet exhibits resistance switching properties.

17. An electrical device comprising the layered compound according to claim 1.

* * * * *